United States Patent [19]

Lahiri

[11] 4,083,029

[45] Apr. 4, 1978

[54] THIN FILM RESISTORS AND CONTACTS FOR CIRCUITRY

[75] Inventor: Syamal K. Lahiri, Ossining, N.Y.

[73] Assignee: International Business Machines Corporation, Armonk, N.Y.

[21] Appl. No.: 599,803

[22] Filed: Jul. 28, 1975

Related U.S. Application Data

[62] Division of Ser. No. 429,461, Dec. 28, 1973, Pat. No. 3,913,120.

[51] Int. Cl.² ............................................ H01L 39/12
[52] U.S. Cl. .................................. 338/32 S; 307/306
[58] Field of Search ............. 338/32 S; 307/306, 212, 307/218, 277, 245; 357/5; 335/216

[56] References Cited

U.S. PATENT DOCUMENTS

| 3,125,688 | 3/1964 | Rogers | 338/32 S X |
| 3,733,526 | 5/1973 | Anccher et al. | 357/5 |
| 3,852,795 | 12/1974 | Ames | 357/5 |

Primary Examiner—C. L. Albritton
Attorney, Agent, or Firm—Thomas J. Kilgannon, Jr.

[57] ABSTRACT

Contacts and resistors are provided for circuitry which are very resistant to interdiffusion and which have good stability. In particular, contacts to superconductive circuitry and resistors for superconductive circuitry are provided. In general, a contact or resistor material is in thermodynamic equilibrium with the materials which are to be contacted. Additionally, the contact or resistor is comprised of an intermediate phase or solid solution which is present in stable form in the materials to be contacted. These intermediate phases or solid solutions are multicomponent systems, such as intermetallic compounds. The contacts or resistors can be formed by layering of suitable materials and the invention can be used to provide good chip-module connections for many types of circuitry.

28 Claims, 13 Drawing Figures

THIN FILM RESISTORS AND CONTACTS FOR CIRCUITRY

This is a division of application Ser. No. 429,461 filed Dec. 28, 1973 now U.S. Pat. No. 3,913,120.

BACKGROUND OF THE INVENTION

1. Field of the Invention

This invention relates to electrical contacts and thin film resistors which can be used with many types of circuitry, and which provide stability and resistance to interdiffusion between the materials to be connected.

2. Description of the Prior Art

Thin film resistors and electrical connections are well known in many prior art circuits. For instance, metallurgical connections have to be provided for electrical contacts to modules and chips in integrated circuitry.

In superconductive circuitry, resistors are often required, and it is also required to provide good contacts between superconductive transmission lines. For instance, circuitry using Josephson tunnelling devices often requires impedance terminations to transmission lines. One such impedance terminated circuit is shown in U.S. Pat. No. 3,758,795. In that patent, a Josephson tunnelling circuit is used to transfer current into a superconducting transmission line which is terminated by the proper resistive material. This transmission line can be used to provide control signals for other Josephson devices.

Provision of thin film resistors is very difficult and it is even more difficult in superconductive circuitry. Resistors must be stable with respect to storage, fabrication and thermal cycling. That is, the resistance value should not change more than a very small percent (perhaps 1%) in order to provide proper tolerance for circuitry. This stability must be present when the circuits are stored at any temperature, when the circuits are fabricated at elevated process temperatures (for instance, 100° C), and during repeated thermal cycling between room temperatures and operating temperatures (i.e., cryogenic temperatures).

These resistors should also be reproducible; that is, the same resistance values should be obtainable over repeated fabrication runs. The resistance values at the operating temperatures of the circuits should be within a certain range each time circuitry is fabricated. This resistance range for reproducibility should be around 5% or less.

Reproducibility of resistance values is a difficult problem. Resistance of thin film materials depends on defects, phonon scattering, thickness, and surface effects. These defects include vacancies, dislocations, grain boundaries, impurities, etc. in the resistor material. To have reproducible resistors, it is necessary that the grain boundaries be reproducible each time the resistor is made. If the mean free path of electrons in the resistor is less than the grain size and less than the thickness of the material, then these effects will not be so important for the reproducibility of resistance values. However, electron scattering due to defects will be important and is a necessary factor to be considered in order to provide reproducible resistors.

The resistance range which can be obtained through the use of these thin film resistors is also an important consideration. The resistance range must be within desired values for proper design of superconductive circuits. For instance, for Josephson circuitry using lead alloy superconducting materials, resistance values of about 0.05–2 ohms/sq. may be desirable in many circuits. Here, the unit ohms/sq. is (resistance) (width)/(length), which is equal to resistivity/thickness.

Further, in the design of Josephson tunnelling circuitry it is desirable to be able to use materials which can be reproducibly deposited at low substrate temperatures. For instance, ground planes comprising Nb are often utilized. These ground planes are covered with an oxide layer after which the tunnelling circuits (including resistors) are deposited. If the temperature at which the thin film resistors are deposited is too great (approximately 150° C) penetration of oxygen from the oxide insulator into the Nb ground plane will occur. This will change the critical temperature of the superconducting ground plane and will also change the thickness of the oxide insulation layer. This change in thickness of the insulation layer will alter the characteristic impedance of transmission lines which are deposited over the insulating layer. This in turn will alter the electrical characteristics of the circuitry. Therefore, it is not desirable to use resistors comprising materials (such as refractory materials) which generally require high temperature deposition in order to be reproducible and stable.

A problem which occurs when contacts or resistors are made is that of interdiffusion. That is, the two materials which are contacted by interposed metallurgy can undergo interdiffusion by which the materials and the metallurgy diffuse into one another. This changes the material compositions and therefore changes the electrical resistance of the deposited resistor. When contacts are provided, interdiffusion can also alter the quality of the connection. Additionally, this diffusion problem may spread to affect the electrodes of tunnel devices which are connected to the resistor. This may cause a serious change in the tunnel junction properties of these devices, leading to further circuit problems. This is an especially difficult problem in large, densely packed arrays of Josephson junctions.

Interdiffusion can occur at room temperatures and at operating temperatures. In the case of superconductive circuitry, room temperature interdiffusion should be very small or approximately zero percent. Additionally, it is not expected that interdiffusion would be a serious problem for superconductive circuits at their operating temperatures, since these will be cryogenic temperatures. That is, because interdiffusion is a thermally activated process, operation of the circuits at cryogenic temperatures will not lead to serious interdiffusion problems.

Interdiffusion should also be minimal at the process temperatures at which the circuits are made as well as at the temperatures used for other steps, such as tailoring and stabilizing of electrical characteristics. For instance, resistors or contacts are often deposited early in the fabrication process by which superconductive circuits are made. This means that these materials must be able to withstand elevated temperatures, as for instance the higher temperatures which are used in subsequent annealing steps. Because of this, interdiffusion at the process temperatures must be controlled.

In addition to interdiffusion problems, resistors and contacts in circuitry often undergo stability changes due to the introduction of structural changes in the materials. For instance, defects in the materials may move into clusters or may migrate to grain boundaries. Also, recrystallization and grain boundary movement may occur in order to relieve stress in the materials, thereby altering the defect nature and density in the materials. These stresses can result due to thermal coefficient differences or due to the growth processes wherein defects, dislocations, vacancies, etc. may move in the material to relieve stresses.

Stability is very important in resistors to be used in low temperature circuitry (cryogenic circuitry). For instance, although solid solutions such as nichrome material, Pb-Ag, and Cu-Au are known as resistors, these solid solutions may not be useful at very low temperatures, such as 4.2° K.

The prior art has not attempted to reduce the driving forces which cause interdiffusion between dissimilar materials which are joined in various circuitry. Additionally, the prior art has not directed its attention to the particular problems posed by superconductive circuitry, where the difference between the process temperatures, room temperatures, and operating temperatures are so large.

In addition to being useful for forming thin film resistors, the present invention can be used to provide interconnections between materials, and in particular provides good interconnections between circuit chips and modules having various electrical conductors thereon. In particular, embodiments will be shown for superconductive packaging between superconducting circuit chips and modules for providing electrical power to these chips. Additionally, embodiments will be shown for providing resistors in Josephson tunnelling device circuitry. These resistors can be comprised of compounds, or solid solutions, if the solid solutions are stable phases of the electrical lines which contact the resistor.

Accordingly, it is a primary object of the present invention to provide metallurgical interconnections which minimize interdiffusion between materials to be connected.

It is another object of this invention to provide techniques for forming resistive terminations to electrical conductors, where interdiffusion between the resistors and the electrical conductors is minimal.

It is another object to provide metallurgical connections to electrical conductors which are thermodynamically in equilibrium with these conductors, and between which interdiffusion is minimal.

It is a further object of this invention to provide resistors for superconductive circuitry, where interdiffusion is reduced.

It is a still further object of this invention to provide interconnection metallurgy for Josephson tunnelling circuits, which are in thermodynamic equilibrium with the circuits and in which interdiffusion problems are minimal.

It is a further object of this invention to provide improved interconnections between superconducting circuit chips and associated modules.

It is another object of this invention to provide interconnections between superconducting Josephson tunnelling circuit chips and circuit modules.

It is still another object of this invention to provide thin film resistors for electrical circuitry which are very stable.

It is a further object of this invention to provide thin film resistors by a layering technique.

BRIEF SUMMARY OF THE INVENTION

This invention can be used for forming improved thin film resistors as well as for providing interconnections between materials, where interdiffusion between all connected parts is minimal. Thus, the present invention can be used to provide chip-module interconnections for many types of circuitry, and in particular for superconductor circuitry.

In order to reduce interdiffusion between materials to be joined, it is proposed that the materials be in thermodynamic equilibrium and contain intermediate phases or solid solutions which exist in stable form in both of the materials to be joined. The intermediate phases or solid solutions are multi-component systems, a particularly good example being intermetallic compounds used to join two metallic materials.

As a particular example, resistive connections for superconducting transmission lines used in Josephson tunnelling circuitry are described. The resistive connections are comprised of intermetallic compounds or solid solutions which have non-superconductive properties at the temperatures of interest and which exist in stable phases in the superconducting transmission lines.

For the following discussion, when a material is called a normal material (i.e., non-superconducting), such designation refers to the properties of the material at the temperatures of interest. For instance, the operating temperature of typical Josephson tunnelling circuits is that of liquid He (4.2° K); consequently, a material which is superconducting only at temperatures less than 4.2° K, would be a normal material at the temperatures of interest (i.e., the temperatures at which devices including this material are used).

Another aspect of this invention is the provision of thin film resistors using a layering technique in which metallic layers are deposited over one another in order to form compounds which are non-superconducting and have the proper resistance values for interconnection to superconducting transmission lines. These compounds exist as stable phases in the transmission lines and consequently the resistors and the transmission lines are in thermodynamic equilibrium with minimal interdiffusion therebetween.

These and other features, objects, and advantages will be more apparent from the following more particular description of the preferred embodiments.

DETAILED DESCRIPTION OF THE PREFERRED EMBODIMENTS

Figure 1:
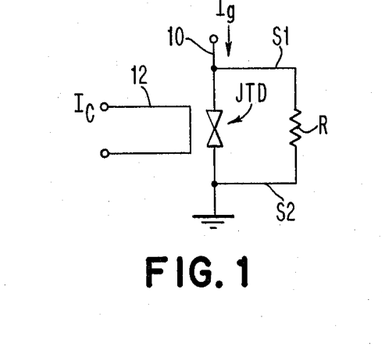
FIG. 1 illustrates the circuit using Josephson tunnelling devices in which interconnections and resistive terminations are required.

FIG. 1 shows a circuit comprising a Josephson tunnelling device JTD which is comprised of superconducting electrodes connected to a superconductor 10. Superconductor 10 is connected to a current source which provides current $I_g$ through the Josephson tunnelling device. Connected to the electrodes of the Josephson tunnel device are superconducting lines S1 and S2. These lines can comprise a superconducting transmission line as is known in the art (U.S. Pat. No. 3,758,795). A resistor R is the termination of lines S1 and S2. As is described in U.S. Pat. No. 3,758,795, the resistance R can be chosen to substantially reduce reflections in the superconducting loop defined by S1 and S2 when JTD switches from a superconducting to a normal state.

A control line 12 is connected to a current source which provides control current $I_c$ therethrough. In a well known manner, current in line 12 can be used to change the magnitude of the maximum Josephson current which can tunnel through JTD. In this manner, the Josephson device can be made to switch from a superconducting state to a normal state in order to deliver a current pulse into the superconducting transmission line comprising S1 and S2.

Figure 2A:
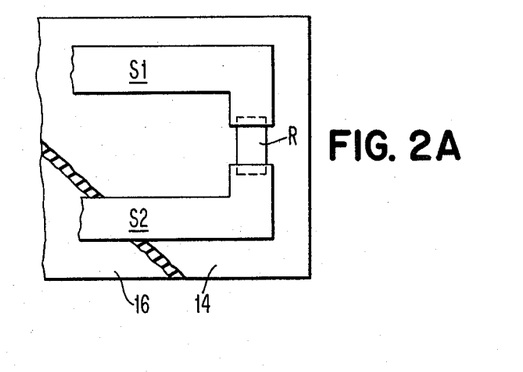
FIGS. 2A and 2B show a top view and side view, respectively, of a portion of the electrical circuit of FIG. 1, illustrating the metallurgical contacts used to provide the electrical circuitry of FIG. 1.
Figure 2B:
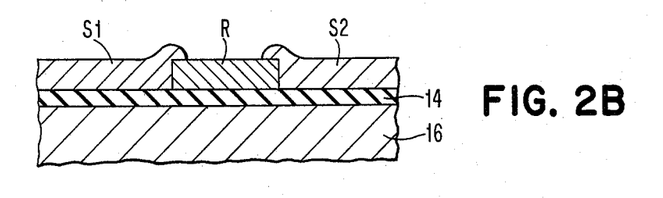

FIGS. 2A, 2B

These figures show a resistive termination R of the superconductors S1 and S2 of the circuit of FIG. 1. In more detail, superconductors S1 and S2 make electrical contact with resistor R. The superconductors S1 and S2, as well as the resistor R, are deposited over an insulation layer 14, which is in turn formed on a superconducting ground plane 16. In a typical Josephson tunnelling device circuit, ground plane 16 is comprised of Nb, while insulator layer 14 is comprised of Nb-oxide, an example being $Nb_2O_5$. Another insulator, such as SiO, can be used over the Nb-oxide. Further, the Josephson tunnelling device has lead-based alloy electrodes such as Pb-In-Au. Superconductors S1 and S2 can also be comprised of these lead-based alloys.

In FIG. 2B, a side view is shown of the structure of FIG. 2A. In this drawing, it is readily apparent that resistor R can be deposited directly on substrate 14, after which superconductors S1 and S2 are deposited in order to make electrical contact with resistor R.

A preferred method for fabrication of this circuit structure uses deposition of resistor R on the ground plane insulation 14, followed by deposition of the base electrode of the Josephson tunnel device. A tunnel junction barrier is then formed after which the counter electrode is deposited. After this, the transmission lines are deposited, followed by an insulation step and then deposition of the control line. Conventional deposition techniques such as evaporation and sputtering can be used.

In the practice of this invention, the resistance R is comprised of a multi-component system which is a stable phase in superconductors S1 and S2. That is, resistance R is comprised of material which is thermodynamically in equilibrium with S1 and S2. For the purposes of this invention, thermodynamic equilibrium between two materials means that there is no large scale atomic migration between them. Higher order effects, such as those due to surface energy, strain energy, entropy, etc. are neglected for the purpose of this definition.

Further, the material comprising resistor R includes an intermediate phase or solid solution which exists as a stable phase in S1 and S2. This solid solution or intermediate phase is a multi-component system and can, for instance, be comprised of intermetallic compounds. In some cases, resistance R is comprised of two materials which form stable phases in S1 and S2. The use of multiple phases in resistor R allows variation in resistance values, may enhance reproducibility of resistance values, and further may aid stability.

In the practice of this invention, these intermediate phases and solid solutions are those which are clearly present in the phase diagrams of the materials. This definition excludes elements, etc., which are present in other materials in only microscopic amounts (for example, Pb-Cu systems can exist where the Cu is present in microscopic amounts in adjoining Pb conductor lines).

If resistor R meets the requirements described above, it will exhibit stability and will have minimum interdiffusion with the superconductors S1 and S2. This condition will exist because the driving force for such interdiffusion is minimized when resistor R is comprised of multi-component systems forming stable phases in S1 and S2.

In the description following, conductors S1 and S2 need not be superconductors and material R need not be a resistor. That is, the following examples will broadly describe electrical contacts to a material (designated R) which provide contacts having minimum interdiffusion. Examples will be given for superconductors and for non-superconductors. When R is to be a resistor for a superconductive circuit, it should be non-superconducting in order to exhibit resistance at cryogenic operating temperatures. If material R is not to be used as a resistor, such a requirement is not present.

The electrical contacts and resistance of this invention have stable properties of interest in the desired temperature ranges. For instance, if superconductive circuitry is utilized, such desired temperature ranges may be from cryogenic temperatures to approximately 100° C.

Since alloys containing Pb, In and Au will often be utilized as illustrative examples, it is convenient at this time to describe systems comprised of these materials. Accordingly, the following discussion will detail some of the metallurgy involving binary and ternary systems comprising these elements.

Figure 3:
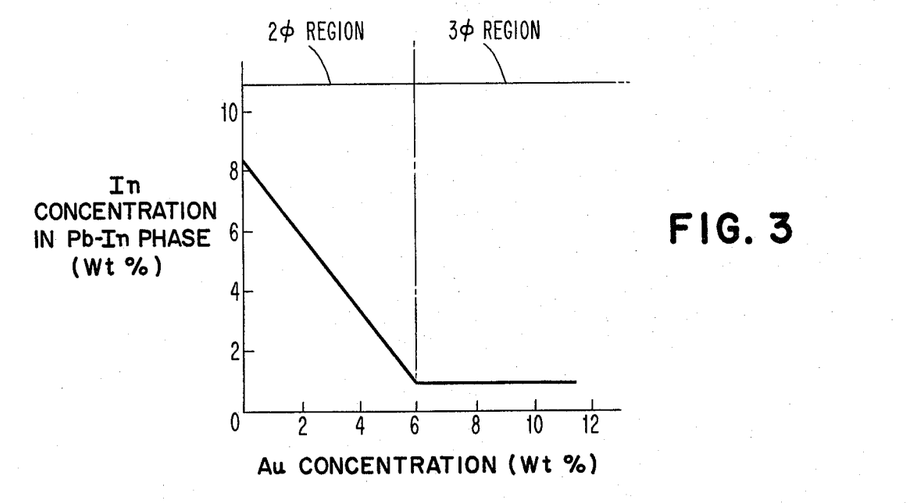
FIG. 3 is a plot of In concentration in a Pb-In phase of a Pb-In-Au alloy, plotted against the Au concentration.

FIG. 3 shows the In concentration in the Pb-In phase of Pb-In-Au alloyed films as a function of the overall Au concentration in the films. This curve, and the ternary phase diagram of FIG. 4, were obtained after analysis of diffraction patterns from In + Pb + Au + Pb and In + Au + Pb films which were sequentially deposited (by conventional techniques) on a substrate (the + sign means that the films were deposited in this order) and then annealed at 75° C for 2 hours or stored at room temperature for six weeks after deposition. Film alloys containing 8 wt. % In and up to about 6 wt. % Au contain Pb-In solid solution and $AuIn_2$ phases. However, upon increasing the Au concentration beyond about 6 wt. % (up to about 12 wt. %), the presence of an additional phase (AuIn) was detected by x-ray diffraction technique. In the three phase region of composition, the composition of each phase remained invariant in accordance with the Phase Rule. Analysis of the relative line intensities of the diffraction peaks indicated that the proportion of AuIn increased at the expense of AuIn$_2$ as the Au concentration was increased from about 6 to 12 wt. %.

In FIG. 3, the In concentration of the Pb-In phase decreases linearly from about 8 wt. % with increasing Au concentration. The third phase (AuIu) appears when In concentration of the Pb-In phase is approximately 0.8 wt. %. The In concentration in the Pb-In phase in the two-phase region can be estimated approximately from the relationship $C_{In} = Co - 1.3C_{Au}$, where the concentration $C$ is given in weight percent and $Co$ is the In concentration of the alloy.

Figure 4:
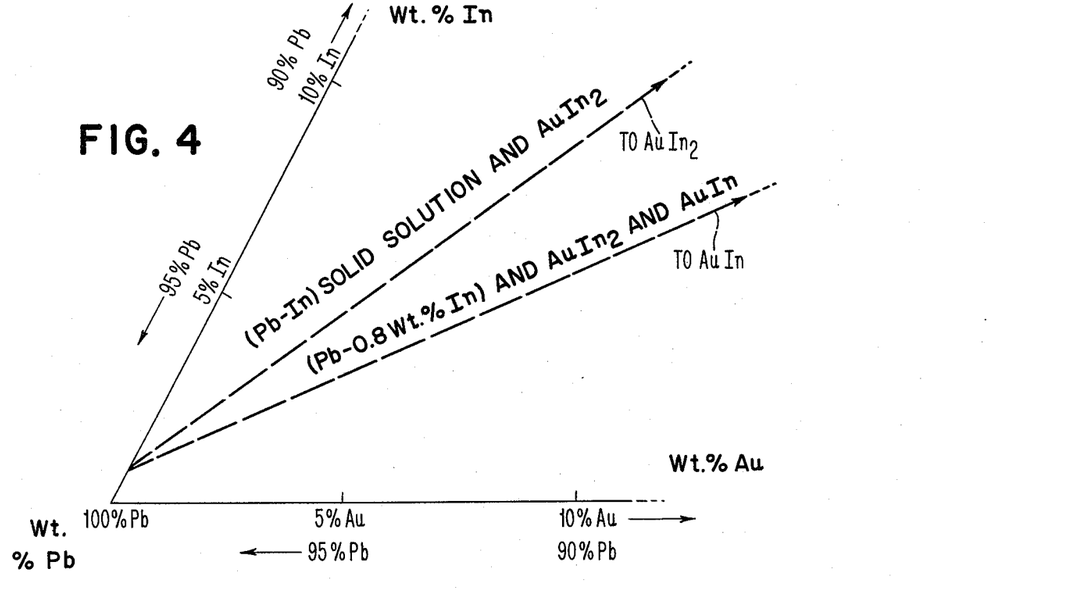
FIG. 4 is a portion of a ternary phase diagram for a Pb-In-Au alloy system.

FIG. 4 shows a ternary phase diagram of the Pb-In-Au system, over a limited Pb rich region. This diagram gives the possible phases present for various compositions and temperatures. It is only a small portion of a complete ternary phase diagram of this system but is useful for considering the alloys used in the present invention.

More particularly, FIG. 4 shows the Pb-rich corner of the ternary Pb-In-Au phase diagram at room temperature and at one atmosphere pressure. From this diagram, it can be seen that the two-phase region is comprised of Pb-In$_x$ solid solution and AuIn$_2$. A three-phase region, which begins to occur when the Au concentration is about 6%, is comprised of a solid solution of Pb-0.8 wt. % In. The In concentration remains approximately constant for alloys having greater than about 6 wt. % Au. The other phases present in the three-phase region of this ternary system are AuIn and AuIn$_2$.

In the following different examples, materials comprising S1 and S2 can be superconductive or normal materials. In the same manner, R designates a material which could be a resistor or an electrical contact. The material R need not make electrical contact with two other conductors S1 and S2, but can instead make contact with only one conductor. Accordingly, these examples are general ones where various possible configurations can be used and in which various materials can be present in S1, S2, and R.

System 1

R is comprised of material A, where A is present in both S1 and S2. S1 and S2 are identical. In this situation, the driving force F for interdiffusion is zero. Material A is a stable phase which is present in both S1 and S2.

An example of this system is S1 = S2 = Pb-8 wt. % In – 0$^+$ to 6 wt. % Au and A = AuIn$_2$. Since AuIn$_2$ is a normal metal at temperatures above about 0.3° K, it can be used as a resistor when the materials S1 and S2 are superconductors, and operation is at 4.2° K (liquid He).

Another example is S1 = S2 = Pb – approximately 5 wt. % Mg, and A = Mg$_2$Pb. Here, Mg$_2$Pb is a normal metal (at the operating temperature) which is a stable phase of S1 and S2. Since this is a normal metal, it can be used as a resistor in superconductive circuitry. However, if a pure electrical contact were desired, R = Pb-Mg solid solutions would suffice since that is also a stable phase present in S1 and S2.

A further example is S1 = S2 = Pb – 28 wt. % Au, and A = AuPb$_2$ or AuPb$_3$. Here, both AuPb$_2$ and AuPb$_3$ are stable phases in S1 and S2. However, AuPb$_3$ is a superconductor around 4° K and consequently would make a poor resistive material in superconductive circuitry. For this reason, AuPb$_2$ is a preferred material if a resistor is desired.

Another example is S1 = S2 = AuIn or AuIn$_2$ and R = AuIn + AuIn$_2$. Here, $R = A + C$, where $C$ is the component of R not present in S1 and S2.

Another example is that where S1 = S2 = Pb-Al-Au alloy and R is a phase stable in the S1, S2 alloy. For example, R could be AuAl$_2$ and/or AuAl, which can be present in stable form in Pb-Al-Au alloys.

Still another example uses a conductor of Al-4 wt. % Cu, and $R$ = CuAl$_2$, which is a resistive material. If desired, the conductor can be Al-25 wt. % Au, while the interconnection is $R$ = AuAl$_2$. Both the CuAl$_2$ and AuAl$_2$ intermetallic compounds can be stable phases in the respective conductors mentioned.

The conductors S1 and/or S2 can be Pb-In-Cu alloys and R can be Cu$_9$In$_4$, an intermetallic compound which is present in selected Pb-In-Cu alloys. A related example uses $R$ = AgIn$_2$ and/or Ag$_2$In, while the conductor is an alloy of Pb-In-Ag which contains either or both of these intermetallic compounds.

System 2

R is comprised of A, and A is a stable phase in both S1 and S2. S1 $\neq$ S2. Here, the net driving force is not equal to zero since A may be slightly different in S1 and S2. There will be no interdiffusion between R and S1 or between R and S2. However, the total system S1 + R + S2 does not have a zero net driving force unless A is perfectly stoichiometric and therefore the same in both S1 and S2. However, this is still a good system for many applications and the interdiffusion will be minimal.

An example is S1 = superconductive Pb – 8 wt. % In – 3 wt. % Au while S2 = superconductive Pb – 8 wt. % In – 8 wt. % Au. $R = A$ = AuIn$_2$. Thus, A is a phase which is present and stable in both S1 and S2 (see FIGS. 3 and 4).

Another example is S1 = superconductive Pb – 8 wt. % In – 3 wt. % Au, and S2 (not superconductive) = AuIn + AuIn$_2$. Material $R = A$ = AuIn$_2$. This system will not be in perfect thermodynamic equilibrium but can be used to provide a resistor comprising AuIn$_2$.

System 3

S1 = S2 and $R = A + B$, where $A$ and $B$ are different compounds or solid solutions. A and B are present in both S1 and S2.

This situation is essentially the same as that in situation 1, except that now there are two phases in R, and both are present in S1 and S2. Hence, the net driving force will be approximately zero and interdiffusion will be minimal.

The advantages of having two phases present in R are that resistance values and other properties can be modified somewhat by the presence of two phases. In addition, stability may be enhanced.

An example is S1 and S2 = Pb – 8 wt. % In – 8 wt. % Au. $R$ = AuIn$_2$ + AuIn. These phases comprising R are present in S1 and S2.

System 4

S1 $\neq$ S2 and $R = A + B$, where $A$, $B$ are stable phases. Phase A is present and stable in S1 while phase B is present and stable in S2.

Whether there is interdiffusion between S1 and R and between S2 and R depends upon the materials comprising these components.

As an example, S1 = AuIn$_2$, S2 = AuIn, and R = AuIn$_2$ + AuIn. Here, A = AuIn$_2$ and B = AuIn.

Another example is S1 = Pb − 3 wt. % In solid solution, S2 = AuIn$_2$ intermetallic compound, and R = A + B = Pb − 3 wt. % In + AuIn$_2$.

A related example is the following: If S1 is Pb − 8 wt. % In − 3 wt. % Au, while S2 is Pb − 8 wt. % In − 8 wt. % Au, a termination R = In$_2$Au + AuIn would partially prevent interdiffusion. That is, there would be no interdiffusion between R and S2, but there would be some interdiffusion between S1 and R. In this particular example, the stable phases of S1 are AuIn$_2$ and Pb-In$_x$ solid solutions. The stable phases of S2 are AuIn, AuIn$_2$, and Pb-In solid solution. Thus, R would have two phases, both of which are present in S2, while only one phase of R would be present in S1. The entire system comprising S1, R and S2 is stable only if A and B are stable at certain compositions. If this is so, all materials will have the same chemical potentials in all parts of the system, and equilibrium will result.

System 5

R is comprised of two phases, A, B. S1 is not the same as S2. S1 is comprised of A + C and S2 is comprised of B + C.

This system is in thermodynamic equilibrium only for the case where the intermediate phases A and B are stable at certain compositions. If A, B occur only at fixed stoichiometric compositions, then thermal equilibrium exists in the entire system S1-R-S2.

Phase A is in equilibrium with S1 = A + C and is also in equilibrium with phase B. However, these equilibriums are different so some chemical driving potential exists. Therefore, A and B must have fixed compositions with no stoichiometric ranges in order that the entire system by thermodynamically in equilibrium. These same factors are true with respect to R = A + B and S2 = B + C. Systems comprising materials following these guidelines will be thermodynamically stable and useful for electrical contacts and resistors.

System 6

S1 ≠ S2 and R = A + B, where A and B are phases which are in thermodynamic equilibrium with one another. Conductor S1 is comprised of A and C while conductor S2 is comprised of B + D.

As in case 5, this entire system S1-R-S2 is in thermodynamic equilibrium if phases A and B are stable within very narrow ranges of their constituents. That is, phases A and B, which are present in S1 and S2 respectively, must be stoichiometric in order that total system equilibrium results. However, R will not be in perfect thermodynamic equilibrium with S1 and with S2, since phase B is not present in S1 while phase A is not present in S2.

FIGS. 5A–7B

These figures show various embodiments for making suitable resistors for use in Josephson tunnelling circuitry, as well as connectors for electrical packaging.

Figure 5A:
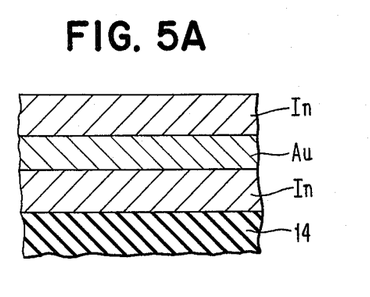
FIGS. 5A and 5B are side views illustrating how specific intermediate phases can be provided for a Pb-In-Au metallurgical system.
Figure 5B:
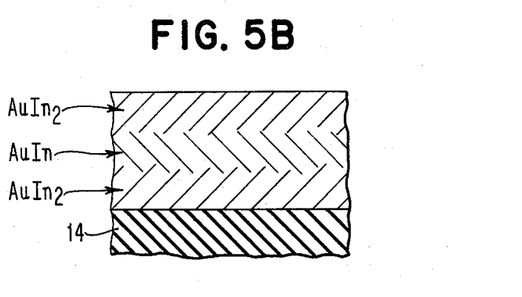

In FIG. 5A, sequential layers of In, Au, and In have been deposited on substrate 14. As typical values, the In layers can be about 1000 A, while the Au layer is about 800 A. These layers are deposited in the sequence indicated by sputtering or evaporation. Of course, co-deposition of Au and In can also be used. Diffusion of the layers occurs around room temperature and the structure of FIG. 5B is then obtained. This structure contains the phases AuIn and AuIn$_2$.

The structure of FIG. 5B will have a different resistivity than a structure which combines Au and In in a stoichiometric ratio. For example, the structure of FIG. 5B has a higher resistivity than AuIn$_2$ (for the same dimensions). If the layers in FIG. 5A are deposited with an Au concentration higher than that in AuIn$_2$, Au-rich intermetallics would form in the interior of the films while the surfaces would contain primarily AuIn$_2$ (if Au ≲ 62%), and possibly a little unreacted In.

The composite film of FIG. 5B can be used to contact Pb-In-Au films in the manner previously described. If any unreacted small amount of In remains after AuIn$_2$ is formed, it may diffuse into the Pb-In-Au films thus leaving AuIn$_2$ in contact with the Pb-In-Au films. In the same manner, if a small amount of unreacted Au remains, it may diffuse into the Pb-In-Au films without affecting the resistivity of the AuIn$_2$ layers. Such excess amounts of Au or In may result if larger quantities of these materials are used to form the compounds than are required for compound formation.

In the resistors of FIGS. 5A, 5B, 6A and 6B, the intermetallic compounds of In and Au can be varied, depending on the relative amounts of these materials. Also, the deposition sequence of the layers can be changed. For instance, in FIG. 6A, In could be deposited initially, after which an Au layer can be deposited.

Since the relative thicknesses of the In and Au layers determines the relative amounts of each material, and therefore, the compounds which are formed, this provides a convenient technique for forming intermetallic compound thin film resistors. From the two-phase diagram for the In-Au system, the following is determined.

(1) if Au is less than 46% by weight, then AuIn$_2$ and free In will result. This free In can diffuse into conductors contacting this structure (In-Au system), especially if the conductors are alloys such as Pb − 8 wt.% In − 3 wt.% Au.

(2) When Au is present in an amount approximately 46-62 wt.%, while In is present in an amount about 54-38 wt.%, the compounds AuIn and AuIn$_2$ will result. These can also be used to contact Pb-In-Au alloys, in which these compounds exist as stable phases.

(3) if Au is present in amounts greater than about 63 wt.% and up to about 80 wt.%, the compounds Au$_9$In$_4$ and AuIn will form when the In and Au diffuse into one another. Again, these are stable compounds which can be used as resistors or contacts to conductors containing these compounds as stable phases.

Figure 6A:
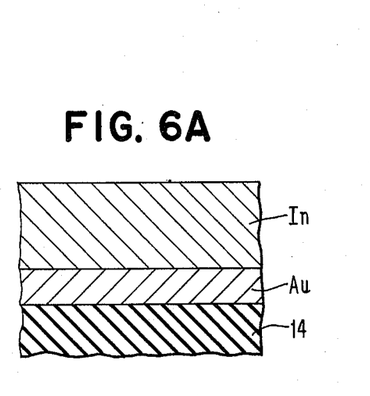
FIGS. 6A and 6B show another technique and structure for providing particular stable phases of a system usable with Pb-In-Au metallurgy.
Figure 6B:
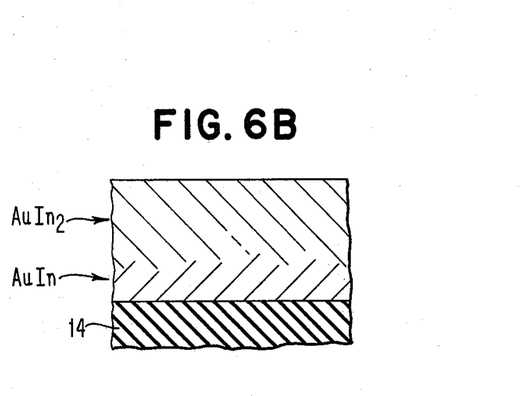

FIGS. 6A and 6B show other deposition sequences used to get stable phases of In and Au. In FIG. 6A, a layer of Au (typically about 800 A) is deposited on substrate 14, after which a layer of In (about 2000 A thick) is deposited on the Au layer. Because Au and In have high diffusivity in one another, the structure of FIG. 6B will result. This is a layer of the phase AuIn on top of which is a layer of the phase AuIn$_2$.

If the Au and In are present in the amount 56 wt.% Au and 44 wt.% In, deposition of Au and In layers will result in the phases shown in FIG. 6B. That is, by altering the Au and In amounts from stoichiometry, various phases can be formed (including AuIn, Au$_9$In$_4$, etc.) for use as electrical connections or resistive connections. For instance, if the In layer is about 2000 A and the Au layer is about 653 A, the compound AuIn$_2$ will result.

In the case of AuIn$_2$, conductor layers which can be brought into electrical contact with this material by deposition thereon include Pb-8 wt.% In-3 wt.% Au. These Pb alloy contacts can be made by depositing the alloys on the AuIn$_2$ layer. Since AuIn is in thermodynamic equilibrium with AuIn$_2$, no chemical driving force will result and interdiffusion in the system will be minimized.

Several advantages occur when AuIn$_2$ resistors are used with Pb-In-Au films. Because of the relatively high diffusivities of Au and In and In and Au, it is possible to form the compounds at relatively low temperatures even when the Au and In films are deposited sequentially. Thus, the potentially deleterious effects of temperature and thermally-induced stress on films deposited prior to the resistor film should be minimal. For example, formation of the resistor at relatively low temperatures (e.g., below about 100° C) may be necessary for preventing possible diffusion of oxygen into an underlying ground plane layer, as described previously.

Another possible advantage of using AuIn$_2$ resistors involves the presence of excess In in the system. For an In concentration greater than that in stoichiometric AuIn$_2$, pure In remains in thermodynamic equilibrium with AuIn$_2$ below 154° C. In such a case, it is expected that a small excess of In in the resistor will readily diffuse into the Pb-In-Au alloy interconnection films without introducing contact resistance or altering the superconducting characteristics of these interconnection films.

As previously stated, AuIn$_2$ films can be formed by sequential deposition of about 54% In and 46% Au. Pressure during deposition can be in the 10$^{-7}$ Torr range and substrates can be maintained at about 75° C during deposition. Deposition rates of about 1-10 Angstroms/second are typically used and the total film thickness can be about 2600 Angstroms.

Diffraction data obtained from a composite resistor containing 55% In and 45% Au reveals the presence of roughly 3% free In in addition to the compound AuIn$_2$. However, this excess free In will diffuse into the electrically contacting films as explained previously.

The resistance per square of single phase AuIn$_2$ films (of about 2600 A thickness) at 4.2° K is about 0.1 ohms/square ± 15%. For this data, a variation of ± 15% was not considered significant because of the many different conditions used for depositing various samples and because of some variation in sample geometry. For a two-phase resistor comprising AuIn and AuIn$_2$ having a thickness of about 2600 A, the resistance is about 0.2 Ω/sq. In the case of a two-phase resistor comprised of Au$_9$In$_4$ and AuIn, having a thickness of about 2600 A, the resistance is about 0.4 Ω/sq. Thus, it is apparent that different resistance values can be obtained by using resistors having different and/or multiple phases. Additionally, the resistance of the two-phase resistors can be changed by changing the phases which comprise the resistor. Thus, a resistor of AuIn + Au$_9$In$_4$ will have a higher resistance than a resistor of AuIn$_2$ + AuIn.

The resistance of a thin film resistor in accordance with this invention can also be varied by varying the deposition rate of the Au layer which is deposited on an underlying In layer, or the deposition rate of an In layer which is deposited on an underlying Au layer. Further, the resistance of these compound resistors can be varied by changing the substrate temperatures at which they are deposited. Thus, these In-Au resistors can be deposited at substrate temperatures typically up to about 100° C and will have typical thicknesses up to about 4000 A.

Upon annealing the as-deposited films of AuIn$_2$ at 100° C for 2 hours, the resistance decreased by less than 3%. No significant changes in film composition or structure resulted. Diffraction analysis after annealing of the resistor containing an overlying Pb-In-Au film substantiated that the chemical driving force for interdiffusion is zero in this system.

Thus, thin films of AuIn$_2$ are suitable candidates for terminating Pb-In-Au alloy films which can be used for intraconnection in Josephson tunnelling circuits. Experimentally measured resistance of AuIn$_2$ films at 4.2° K was about 0.1 ohm/sq. and their resistance ratio $R_{298° K}$, was about 4.5. If the average resistor film thickness (approximately 2600 Angstroms) is used to estimate resistivity, the resistivity of the films at 4.2° K is calculated to be about 2.6 micro-ohm-cm. This is considered consistent with data for bulk samples of AuIn$_2$, taking into account that the resistivity of the thin film conductor at low temperatures is greater than bulk resistivity because of factors such as dimensions, presence of grain boundaries, defect concentrations, etc.

The Au-In compound connections shown in FIGS. 5B and 6B are shown as layers, i.e., the AuIn and AuIn$_2$ compounds are in layers in these structures. If the In and Au are initially deposited as layers, compound layers may likely result; however, such a situation is idealized. The compounds AuIn and AuIn$_2$ may be scattered throughout the composite resistor or interconnection, which will not alter the principles expressed herein.

Figure 7A:
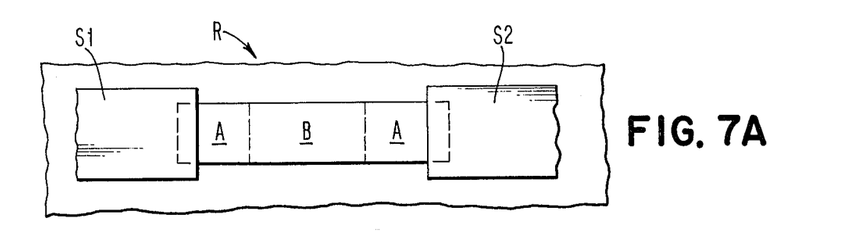
FIGS. 7A and 7B illustrate connective metallurgies which are structurally different but metallurgically equivalent for joining conductors S1 and S2, in a manner which minimizes interdiffusion therebetween.
Figure 7B:
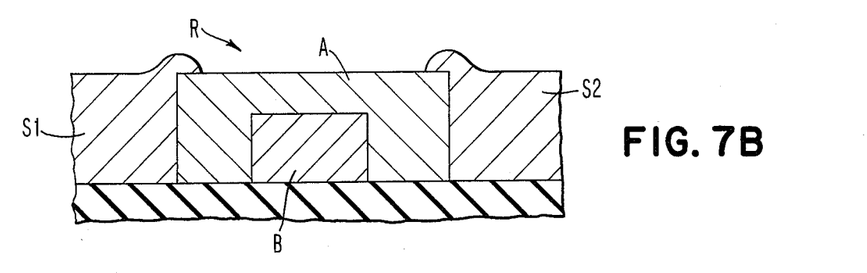

FIGS. 7A and 7B show another structure for electrical connections or resistive terminations. Here, conductor S1 and conductor S2 are electrically contacting a structure R which is comprised of phases A and B. The connections are made such that S1 and S2 contact the phase A of R.

FIG. 7B is an alternate embodiment which is analogous to that of FIG. 7A in which the location of the various layers on substrate 14 is shown. The structures of FIGS. 7A and 7B are metallurgically equivalent. Composite R is comprised of a first layer comprised of phase B over which is deposited a second layer comprised of the phase A. The thicknesses of these layers are not critical and they can have about the same thicknesses. Deposition of conductor S1 and S2 brings them into contact with the layer containing phase A.

In this example, phase A is present in S1 and S2, although phase B is not present in S1 and S2. However, if phases A and B are in thermodynamic equilibrium with each other, no net diffusion will take place between A and S1 and between A and S2. This is because phase A will not change in composite R and because it is in equilibrium with S1 and S2.

As an example of some of the materials which can be used for phases A and B of FIG. 7B, phase A can be AuIn$_2$ while phase B can be AuIn. Conductors S1 and S2 are Pb-8 wt.% In-3 wt.% Au alloys as mentioned previously.

Since phase B is not in contact with S1 and S2, it can be comprised of any material which is stable with respect to phase A (i.e., there is no diffusion between A and B at the temperatures of interest). As an example, when phase A is AuIn$_2$, and S1 is Pb-8 wt.% In-3 wt.% Au, phase B can be a refractory material (such as Ti) which won't react with phase A at the operating temperatures, or can be AuIn as mentioned previously.

Electrical Interconnections, Chip-Module Packaging

The practice of this invention is also suited for electrical connections between conductors, especially in superconductive packaging. By using multi-component stable phases which are present in the materials to be connected, interdiffusion problems are minimized.

Figure 8A:
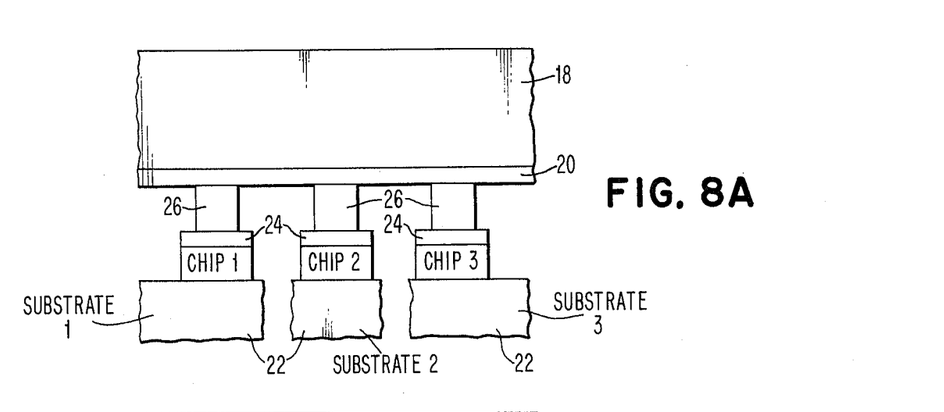
FIGS. 8A and 8B illustrate two techniques for joining circuit chips to a module, in which the interconnection metallurgy substantially prevents interdiffusion between the electrical lines on the circuit chips and the module which are connected.

FIG. 8A shows a circuit module 18 which has a conducting line 20 at one end thereof. Module 18 is to be electrically connected to circuit chips 1, 2, and 3 which are located on an appropriate substrate 22. Of course, separate substrates can be provided for each of the circuit chips. For instance, chips 1-3 can be comprised of superconductive circuitry such as Josephson tunnelling circuits.

Chips 1-3 have conductors 24 thereon which are to be joined to conductor 20 via interconnections 26.

In the case of superconductor circuitry, conductor 20 may be comprised of Pb-about 5 wt.% In or Pb-8 wt.% In-3 wt.% Au, for instance. Conductor 24 on the circuit chips may be comprised of Pb-8 wt.% In-3 wt.% Au. A proper interconnection metallurgy 26 which will prevent interdiffusion in the system comprising conductors 20 and 24 as well as interconnection 26, may include $AuIn_2$ or Pb-5 wt.% In. $AuIn_2$ is an intermetallic compound while Pb-5 wt.% In is a solid solution of Pb and In. If conductor 20 is comprised of Pb-3 wt.% In, then interconnection 26 of $AuIn_2$ will be thermodynamically stable with conductor 20, and no diffusion will occur between conductor 20 and interconnection 26. In order to have a superconducting package comprising conductors 20, 24 and interconnection 26, the AuIn or $AuIn_2$ layer must be very thin (less than about 100 Å). These materials can be provided as described previously and can be more fully understood by referring to the curve of FIG. 3 and the ternary phase diagram of FIG. 4.

Figure 8B:
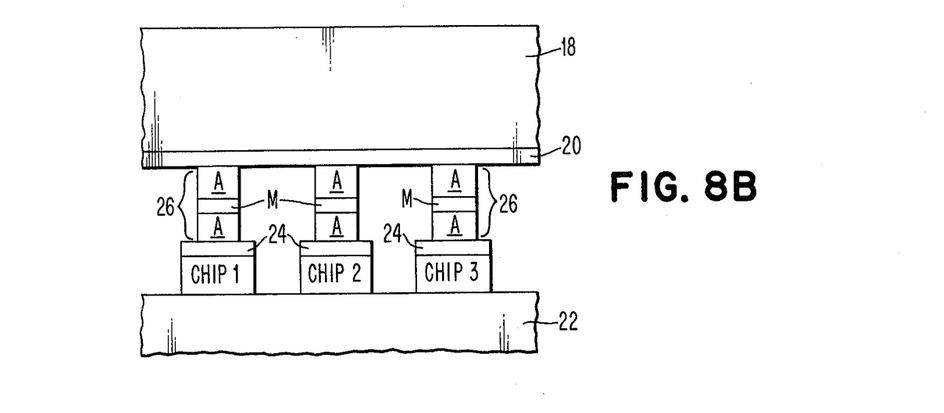

FIG. 8B shows a variation of FIG. 8A in which the interconnection metallurgy 26 includes an intermediate layer M. This layer is used to increase the strength of the bond between the module 18 and the various circuit chips, etc. It is desired that it be a material which is stable with respect to diffusion at the temperature of interest.

As an example of the materials which can be used in the structure of FIG. 8B, conductor 24 can be Pb-8 wt.% In-3 wt.% Au while conductor 20 is the same material or Pb-5 wt.% In. Material A is Pb-5 wt.% In and layer M is comprised of $AuIn_2$.

As another example, material M can be AuIn if material A is $AuIn_2$. In the case where M is comprised of $AuIn_2$ and layers A are Pb-5 wt.% In, it is suitable to have conductor 20 be Pb-5 wt.% In. In all cases, if a superconducting bond is required, layer M must be very thin (about 100 Å or less) if it is a normal material, such as AuIn or $AuIn_2$. This insures that the composite 26 will be superconducting, by the proximity effect.

If the material in layers A is $AuIn_2$, thermal bonding can be used to join the chips to the circuit module 18. Additionally, if the material comprising layers A is a solder of Pb-3 wt.% In, thermal bonding can also be used to attach the chips to the circuit module 18.

The intermetallic compound thin film resistors of the present invention have been found to exhibit a resistivity which is invariant with film thickness for thicknesses less than about 1300 Angstroms. As an example, thin film resistors comprising In and Au compounds having Au present in amounts approximately 46-56 wt.% exhibit this invariant resistivity. This indicates that for resistors less than about 1300 Angstroms, the mean free path for electron scattering is invariant. This result is contrary to what one would normally expect and is a result which is highly desirable for electronic circuitry. This means that sheet resistance reproducibility of resistors having thicknesses in the range of invariant resistivity will be governed only by the dimensions of the resistor and not by any change in the film characteristics due to dimensional changes.

What has been shown is a technique for joining dissimilar materials in a manner which prevents interdiffusion between the materials. Additionally, thermodynamic stability results and this technique can be used for a wide range of applications. It is particularly advantageous with respect to superconducting circuitry where superconducting circuit chips are to be joined to modules, or resistive terminations are to be provided to superconductive lines.

The invention contemplates that materials which are to be joined should have common stable phases present in each of the materials. While specific examples have been presented for purposes of illustration, it will be readily understood by those having metallurgical skill that other materials can also be used in accordance with the principles of this invention.

What is claimed is:

1. A circuit having a first conductor which contacts a second conductor of different composition, said first and second conductors being comprised of the same multi-component solid solution or compound, which exists as a stable phase in each of said conductors.

2. The circuit of claim 1, where said first conductor is a superconductor.

3. The circuit of claim 1, where said solid solution and said compound are comprised of metals.

4. The circuit of claim 1, where said first and second conductor include both said solid solution and said compound as stable phases thereof.

5. The circuit of claim 1, where said first conductor is an alloy of lead.

6. The circuit of claim 1, where said compound is an intermetallic compound.

7. A thin film resistor comprising:
a substrate on which said resistor is formed,
a resistor comprised of an intermetallic compound,
a conductor electrically connected to said resistor, said conductor having said intermetallic compound present as a stable phase therein.

8. The resistor of claim 7, where said conductor is an alloy.

9. The resistor of claim 7, where said conductor is a superconductor.

10. The resistor of claim 7, where said resistor includes more than one compound.

11. A thin film circuit, comprising:
a substrate,
a resistor comprising a multi-component solid solution, said resistor being formed on said substrate,
a conductor electrically connected to said resistor, said conductor having said multi-component solid solution present as a stable phase therein.

12. The circuit of claim 11, wherein said conductor is an alloy.

13. The circuit of claim 11, where said conductor is a superconductor.

14. An interconnective metallurgy for electrical circuits, comprising:

first and second conductors having a connective material therebetween, said first and second conductors including said connective material as a multicomponent stable phase thereof.

15. The metallurgy of claim 14 where said conductors are superconductors.

16. The metallurgy of claim 14 where said connective material is a superconductor.

17. The metallurgy of claim 14, where said connective material is a normal material.

18. The metallurgy of claim 14 where said conductors are located on circuit chips including electrical circuitry.

19. The metallurgy of claim 14 where said first conductor is located on a chip having circuitry thereon and said second conductor is located on a module having current carrying conductors thereon.

20. The metallurgy of claim 14, where said first and second conductors are comprised of lead alloys.

21. A contact arrangement comprising a pair of conductors of different composition which are in contact with one another wherein the material of one of said conductors is comprised of a multi-component phase which is in thermodynamic equilibrium with the material of the other of said conductors.

22. A contact arrangement according to claim 21 wherein said multi-component phase is $AuIn_2$.

23. A contact arrangement according to claim 21 wherein said multi-component phase is a solid solution of lead (Pb) and indium (In).

24. A circuit arrangement according to claim 21 wherein at least one of said pair of conductors is a superconductor.

25. A contact arrangement according to claim 21 wherein the other of said conductors is comprised of indium.

26. A contact arrangement according to claim 21 wherein the other of said conductors is a multi-component phase.

27. A contact arrangement according to claim 26 wherein the multi-component phase is a solid solution of lead (Pb) and indium (In).

28. A contact arrangement according to claim 26 wherein said multi-component phase is an alloy of lead (Pb), indium (In) and gold (Au).

* * * * *